(12) United States Patent
Hamada

(10) Patent No.: US 11,407,443 B2
(45) Date of Patent: Aug. 9, 2022

(54) ELECTRIC DRIVE DEVICE AND ELECTRIC POWER STEERING DEVICE

(71) Applicant: Hitachi Automotive Systems, Ltd., Hitachinaka (JP)

(72) Inventor: Keiji Hamada, Sesaki (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 827 days.

(21) Appl. No.: 16/330,675

(22) PCT Filed: Jul. 31, 2017

(86) PCT No.: PCT/JP2017/027592
§ 371 (c)(1),
(2) Date: Mar. 5, 2019

(87) PCT Pub. No.: WO2018/055913
PCT Pub. Date: Mar. 29, 2018

(65) Prior Publication Data
US 2019/0210636 A1  Jul. 11, 2019

(30) Foreign Application Priority Data

Sep. 26, 2016 (JP) .............................. JP2016-186509

(51) Int. Cl.
*B62D 5/04* (2006.01)
*H02K 9/22* (2006.01)
(Continued)

(52) U.S. Cl.
CPC ........... *B62D 5/0406* (2013.01); *H02K 5/225* (2013.01); *H02K 9/22* (2013.01); *H02K 11/02* (2013.01);
(Continued)

(58) Field of Classification Search
CPC .. B62D 5/0406; B62D 5/0421; B62D 5/0463; H02K 5/225; H02K 9/22; H02K 11/02;
(Continued)

(56) References Cited

U.S. PATENT DOCUMENTS

| 6,268,669 B1 * | 7/2001 | Wakao ................. B62D 5/0406 |
| | | 180/443 |
| 9,912,212 B2 | 3/2018 | Maeshima |

(Continued)

FOREIGN PATENT DOCUMENTS

| JP | 2015-134598 A | 7/2015 |
| JP | 2016-62953 A | 4/2016 |

(Continued)

OTHER PUBLICATIONS

International Search Report (PCT/ISA/210) issued in PCT Application No. PCT/JP2017/027592 dated Sep. 19, 2017 with English translation (five (5) pages).

(Continued)

*Primary Examiner* — John K Kim
(74) *Attorney, Agent, or Firm* — Crowell & Moring LLP

(57) ABSTRACT

An electric drive device includes a motor housing including a housing end face part opposite to an output part of a rotating shaft of an electric motor. The housing end face part includes a power conversion circuit part heat dissipation section and a power supply circuit part heat dissipation section formed to allow at least generated heat of the power conversion circuit part and the power supply circuit part to be transferred to the motor housing. A sensor magnet is fixed to an end part of the rotating shaft opposite to the output part of the rotating shaft and structured to constitute a rotation-sensing target part for sensing rotation of the rotating shaft. The power conversion circuit part heat dissipation section of (Continued)

the housing end face part is positioned closer to the electric motor than the sensor magnet.

8 Claims, 7 Drawing Sheets

(51) Int. Cl.
    *H02K 11/02*     (2016.01)
    *H02K 11/215*     (2016.01)
    *H02K 11/33*     (2016.01)
    *H02K 7/20*     (2006.01)
    *H02K 5/22*     (2006.01)
    *H05K 7/20*     (2006.01)

(52) U.S. Cl.
    CPC .......... *H02K 11/215* (2016.01); *H02K 11/33* (2016.01); *H05K 7/20* (2013.01); *H05K 7/2039* (2013.01)

(58) Field of Classification Search
    CPC ...... H02K 11/215; H02K 11/33; H02K 9/227; H02K 9/02; H02K 11/21; H02K 5/18; H05K 7/20; H05K 7/2039; H05K 7/209; B60Y 2400/307
    USPC ...................................... 310/52, 71; 180/443
    See application file for complete search history.

(56) References Cited

U.S. PATENT DOCUMENTS

| | | | |
|---|---|---|---|
| 2006/0158049 A1* | 7/2006 | Suzuki | H02K 11/33 310/68 R |
| 2011/0254411 A1* | 10/2011 | Minato | H02K 11/33 318/400.26 |
| 2012/0014070 A1* | 1/2012 | Wakita | H05K 1/0206 361/728 |
| 2012/0160596 A1* | 6/2012 | Yamasaki | H02K 11/33 180/443 |
| 2015/0180316 A1* | 6/2015 | Maeshima | H02K 5/225 310/71 |
| 2016/0094175 A1 | 3/2016 | Yamasaki | |
| 2016/0218596 A1 | 7/2016 | Hayashi | |
| 2017/0008554 A1 | 1/2017 | Hirotani et al. | |
| 2017/0305456 A1 | 10/2017 | Iwabuki et al. | |
| 2019/0210636 A1* | 7/2019 | Hamada | H05K 7/2039 |

FOREIGN PATENT DOCUMENTS

| | | |
|---|---|---|
| JP | 2016-73098 A | 5/2016 |
| JP | 2016-140150 A | 8/2016 |
| WO | WO 2015/122069 A1 | 8/2015 |
| WO | WO 2016/117144 A1 | 7/2016 |

OTHER PUBLICATIONS

Japanese-language Written Opinion (PCT/ISA/237) issued in PCT Application No. PCT/JP2017/027592 dated Sep. 19, 2017 (six (6) pages).
U.S. Appl. No. 16/329,204, filed Feb. 27, 2019.
U.S. Appl. No. 16/329,207, filed Feb. 27, 2019.

* cited by examiner

ELECTRIC DRIVE DEVICE AND ELECTRIC POWER STEERING DEVICE

TECHNICAL FIELD

The present invention relates generally to an electric drive device and an electric power steering device, and particularly to an electric drive device and an electric power steering device in which an electronic control unit is provided.

BACKGROUND ART

In a general field of industrial machinery, a controlled object of a mechanical system is driven by an electric motor. In recent years, employment of an electric drive device of mechatronical integration type has been started, wherein the electric drive device includes both of an electric motor and an electronic control unit in a package, and wherein the electronic control unit includes semiconductor elements and others for controlling rotational speed and torque of the electric motor.

As an example of electric drive device of mechatronical integration type, an electric power steering device for an automotive vehicle includes an electric motor, and an electronic control unit (ECU) for controlling the electric motor, wherein the electronic control unit is configured to sense a direction and a torque of rotation of a steering shaft rotated by driver's operation of a steering wheel, and drive the electric motor based on these sensed values, to produce a steering assist torque to rotate the steering shaft in the direction of rotation of the steering shaft.

Japanese Patent Application Publication No. 2015-134598 (patent document 1) discloses a known conventional electric power steering device composed of an electric motor section and an electronic control section. In the electric motor section, an electric motor is housed in a motor housing, wherein the motor housing has a cylindrical part made of an aluminum alloy or the like. In the electronic control section, a board provided with electrical components is attached to a heat sink serving as an ECU housing, wherein the ECU housing is arranged at a side of the motor housing opposite to an output shaft of the electric motor in its axial direction. The board attached to the heat sink is provided with a power supply circuit part, a power conversion circuit part, and a control circuit part, wherein the power conversion circuit part includes power switching elements such as MOSFETs or IGBTs for driving and controlling the electric motor, and wherein the control circuit part is configured to control the power switching elements. Output terminals of the power switching elements and input terminals of the electric motor are connected electrically via a bus bar.

This electronic control part attached to the heat sink is supplied with electric power from a power supply via a connector case made of synthetic resin, and also supplied with a sensing signal indicating operating states and others from sensors and others. The connector case serves as a cover fixed to hermetically cover the heat sink, and is fixed to a surface of an outer periphery of the heat sink by fixing bolts.

Other known examples of electric drive device where an electronic control device is integrally provided include an electric brake device, and an electric hydraulic pressure control device for control of various hydraulic pressures. The following describes an electric power steering device as a representative example.

PRIOR ART DOCUMENT(S)

Patent Document(s)

Patent Document 1: Japanese Patent Application Publication No. 2015-134598

SUMMARY OF THE INVENTION

Problem(s) to be Solved by the Invention

The electric power steering device disclosed in patent document 1 is required to be made compact, because the electric power steering device is mounted within an engine room of an automotive vehicle. Especially, in an engine room of a modern automotive vehicle, many auxiliary devices such as exhaust gas treatment devices and safety enhancement devices are mounted in general. This demands to make each auxiliary device such as an electric power steering device as compact, and reduce the number of components of each auxiliary device as small as possible.

In an electric power steering device as disclosed in patent document 1, a heat sink member is arranged between a motor housing and a connector case for dissipating heat especially from a power supply circuit part and a power conversion circuit part to the outside. The provision of the heat sink member leads to enlarging the axial length of the electric power steering device. Moreover, since electrical components constituting the power supply circuit part and the power conversion circuit part generate a large quantity of heat, it is required to effectively dissipate the heat to the outside, especially when the electric power steering device is made compact. Accordingly, it is desirable to provide an electric drive device which is made as compact in the axial direction as possible and in which heat is effectively dissipated from a power supply circuit part and a power conversion circuit part to the outside.

Furthermore, this electric drive device includes a sensor magnet and a magnetic sensor in order to allow rotation of an electric motor to be controlled, wherein the sensor magnet is provided at a distal end of a rotating shaft of the electric motor, and wherein the magnetic sensor is placed at an electronic control board facing the sensor magnet for magnetism sensing. It is also desirable to shorten a distance between the sensor magnet and the magnetic sensor, and thereby enhance sensitivity of the sensing.

It is an object of the present invention to provide a new electric drive device and a new electric power steering device which are made as compact in the axial direction as possible and in which heat is effectively dissipated from a power supply circuit part and a power conversion circuit part to the outside, and sensitivity of sensing of a magnetic sensor is enhanced.

Means for Solving the Problem(s)

The present invention is characterized in that: a motor housing includes a housing end face part opposite to an output part of a rotating shaft of an electric motor; the housing end face part includes a power conversion circuit part heat dissipation section and a power supply circuit part heat dissipation section formed to allow at least generated heat of the power conversion circuit part and the power supply circuit part to be transferred to the motor housing; a sensor magnet is fixed to an end part of the rotating shaft opposite to the output part of the rotating shaft and structured to constitute a rotation-sensing target part for sensing rotation of the rotating shaft; and the power conversion circuit part heat dissipation section of the housing end face part is positioned closer to the electric motor than the sensor magnet.

Effect(s) of the Invention

According to the present invention, the feature that the generated heat of the power supply circuit part and the power conversion circuit part is transferred to the housing end face part of the motor housing makes it possible to shorten the axial size with no heat sink member provided. Moreover, since the motor housing has a sufficient thermal capacity, the heat generated in the power supply circuit part and the power conversion circuit part can be dissipated to the outside effectively. Furthermore, the feature that the power conversion circuit part heat dissipation section is positioned closer to the electric motor than the sensor magnet, serves to allow the axial size to be further shortened, while allowing the sensor magnet and the magnetic sensor to be positioned close to each other and thereby allowing sensitivity of the sensing of the magnetic sensor to be enhanced.

MODE(S) FOR CARRYING OUT THE INVENTION

The following details an embodiment of the present invention with reference to the drawings. However, the present invention is not limited to the embodiment, but includes various modifications and applications belonging to technical conception of the present invention.

Figure 1:
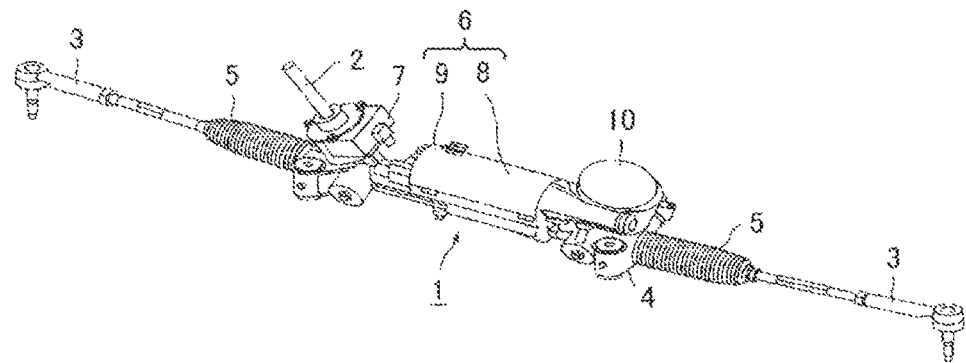
FIG. 1 is a whole perspective view of a steering device as an example of device to which the present invention is applied.

The following briefly describes configuration of a steering device as an example of device to which the present invention is applied, with reference to FIG. 1, prior to description of the embodiment of the present invention.

First, the following describes a steering device for steering front wheels of an automotive vehicle. Steering device 1 is configured as shown in FIG. 1. A steering shaft 2 is connected to a steering wheel not shown, and includes a lower end formed with a pinion not shown, wherein the pinion is in mesh with a rack not shown, wherein the rack extends in a vehicle body lateral direction. The rack includes ends linked to respective tie rods 3 for steering the front wheels leftward and rightward, and is housed by a rack housing 4. A rubber boot 5 is provided between rack housing 4 and each tie rod 3.

An electric power steering device 6 is provided for producing an assist torque while the steering wheel is being turned. Specifically, electric power steering device 6 includes a torque sensor 7, an electric motor section 8, and an electronic control section or unit (ECU) 9, wherein torque sensor 7 is structured to sense a direction of rotation of steering shaft 2, and a rotating torque applied to steering shaft 2, wherein electric motor section 8 is structured to apply a steering assist force to the rack via a gear 10 depending on a sensed value from torque sensor 7, and wherein electronic control section 9 is configured to control an electric motor arranged in electric motor section 8. Electric motor section 8 of electric power steering device 6 is connected to gear 10 by three bolts not shown at three spots of an outer peripheral part of an output shaft side of electric motor section 8. Electronic control section 9 is arranged at a side of electric motor section 8 opposite to an output shaft of electric motor section 8.

Electric power steering device 6 operates as follows. As the steering wheel is turned to rotate steering shaft 2 in one direction, torque sensor 7 then senses the direction of rotation of steering shaft 2, and the rotating torque applied to steering shaft 2. A control circuit part calculates a quantity of operation of the electric motor, based on a sensed value from torque sensor 7. Power switching elements of a power conversion circuit part are controlled to drive the electric motor based on the calculated quantity of operation, so that an output shaft of the electric motor is rotated to drive the steering shaft 2 in the same direction as the direction of operation of the steering wheel. The rotation of the output shaft of the electric motor is transferred to the rack via the pinion and gear 10, thereby steering the automotive vehicle. Further description is omitted because its configuration and operation are well known.

As described above, in an electric power steering device as disclosed in patent document 1, a heat sink member is arranged between a motor housing and a connector case for dissipating heat especially from a power supply circuit part and a power conversion circuit part to the outside. The provision of the heat sink member leads to enlarging the axial length of the electric power steering device. Moreover, since electrical components constituting the power supply circuit part and the power conversion circuit part generate a large quantity of heat, it is required to effectively dissipate the heat to the outside, especially when the electric power steering device is made compact. Accordingly, it is desirable to provide an electric drive device which is made as compact in the axial direction as possible and in which heat is effectively dissipated from a power supply circuit part and a power conversion circuit part to the outside. It is also desirable to shorten a distance between a sensor magnet and a magnetic sensor, and thereby enhance sensitivity of such sensing.

In view of the foregoing background, according to the present embodiment, an electric power steering device is proposed which is configured as follows. Specifically, according to the present embodiment: a motor housing includes a housing end face part opposite to an output part of a rotating shaft of an electric motor; the housing end face part includes a power conversion circuit part heat dissipation section and a power supply circuit part heat dissipation section formed to allow at least generated heat of the power conversion circuit part and the power supply circuit part to be transferred to the motor housing; a sensor magnet is fixed to an end part of the rotating shaft opposite to the output part of the rotating shaft and structured to constitute a rotation-sensing target part for sensing rotation of the rotating shaft; and the power conversion circuit part heat dissipation section of the housing end face part is positioned closer to the electric motor than the sensor magnet.

According to this configuration, the feature that the generated heat of the power supply circuit part and the power conversion circuit part is transferred to the housing end face part of the motor housing makes it possible to shorten the axial size with no heat sink member provided. Moreover, since the motor housing has a sufficient thermal capacity, the heat generated in the power supply circuit part and the power conversion circuit part can be dissipated to the outside effectively. Furthermore, the feature that the power conversion circuit part heat dissipation section is positioned closer to the electric motor than the sensor magnet, serves to allow the axial size to be further shortened, while allowing the sensor magnet and the magnetic sensor to be positioned close to each other and thereby allowing sensitivity of the sensing of the magnetic sensor to be enhanced.

Figure 2:
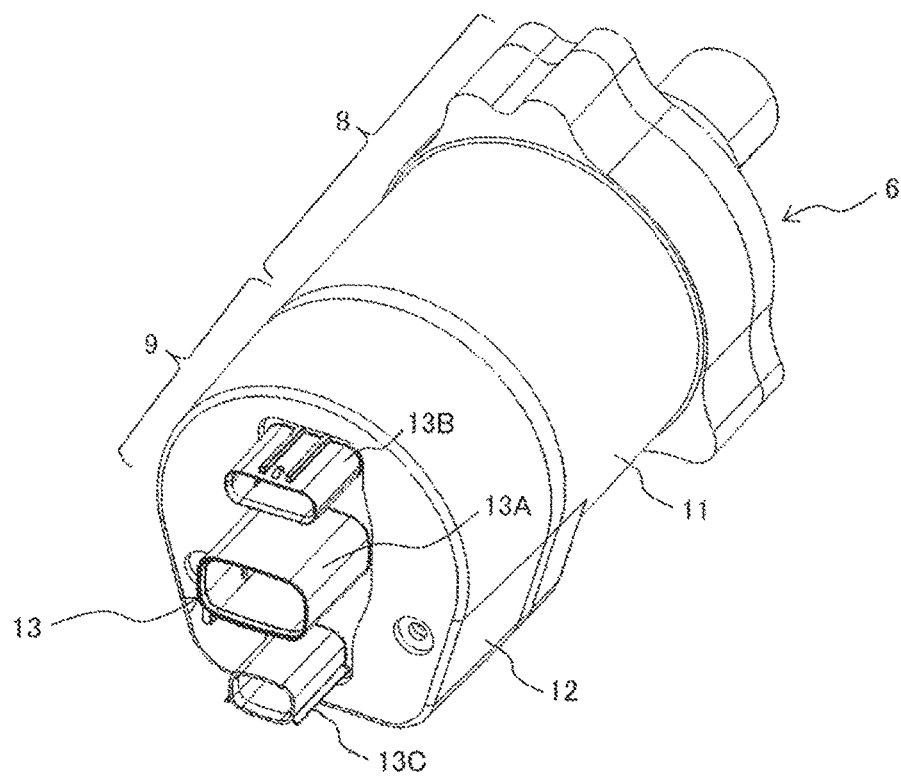
FIG. 2 is a whole perspective view of an electric power steering device according to an embodiment of the present invention.
Figure 3:
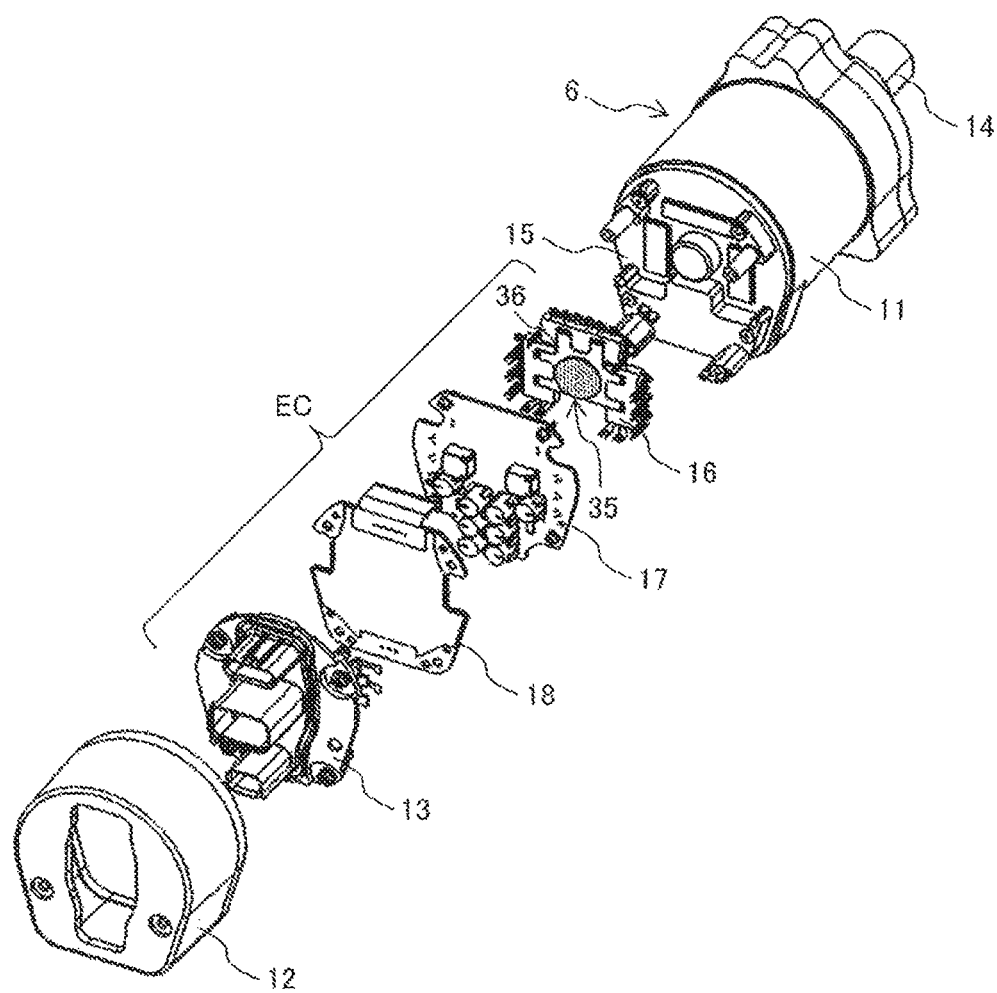
FIG. 3 is an exploded perspective view of the electric power steering device shown in FIG. 2.
Figure 7:
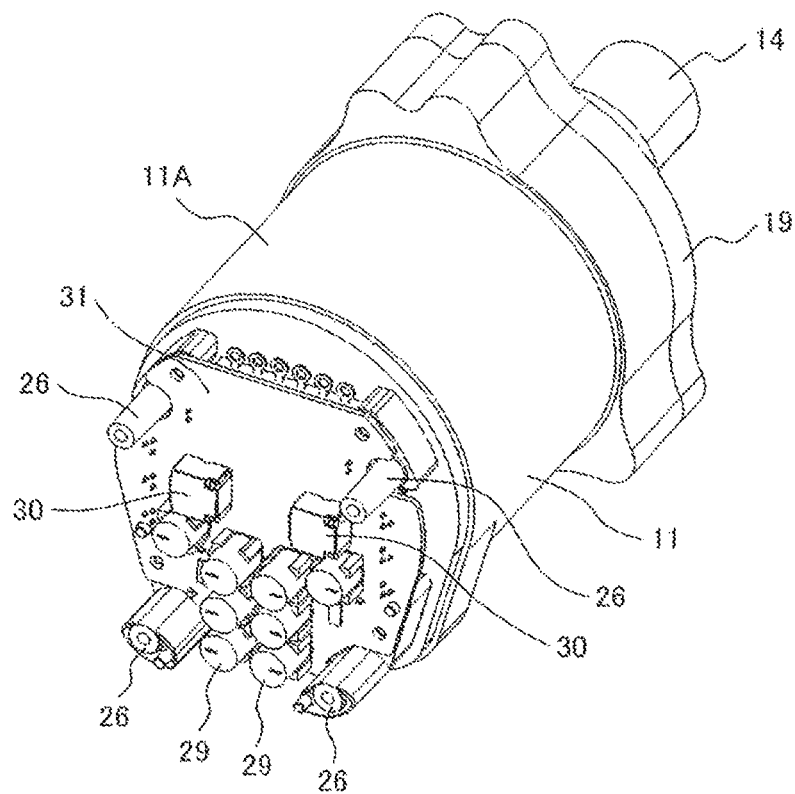
FIG. 7 is a perspective view of the motor housing shown in FIG. 4 where a power supply circuit part is mounted to the motor housing.
Figure 8:
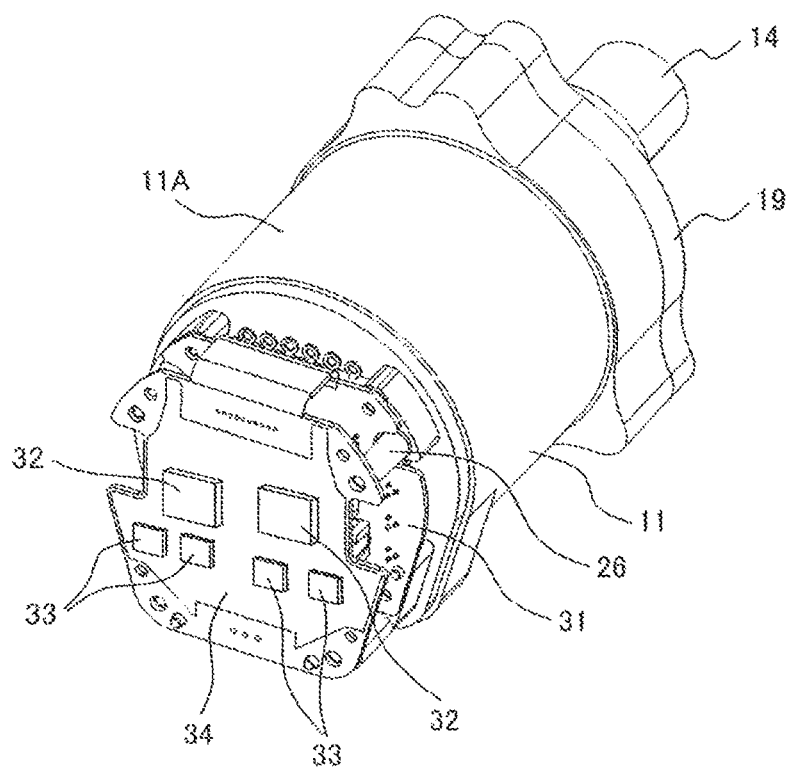
FIG. 8 is a perspective view of the motor housing shown in FIG. 4 where a control circuit part is mounted to the motor housing.
Figure 9:
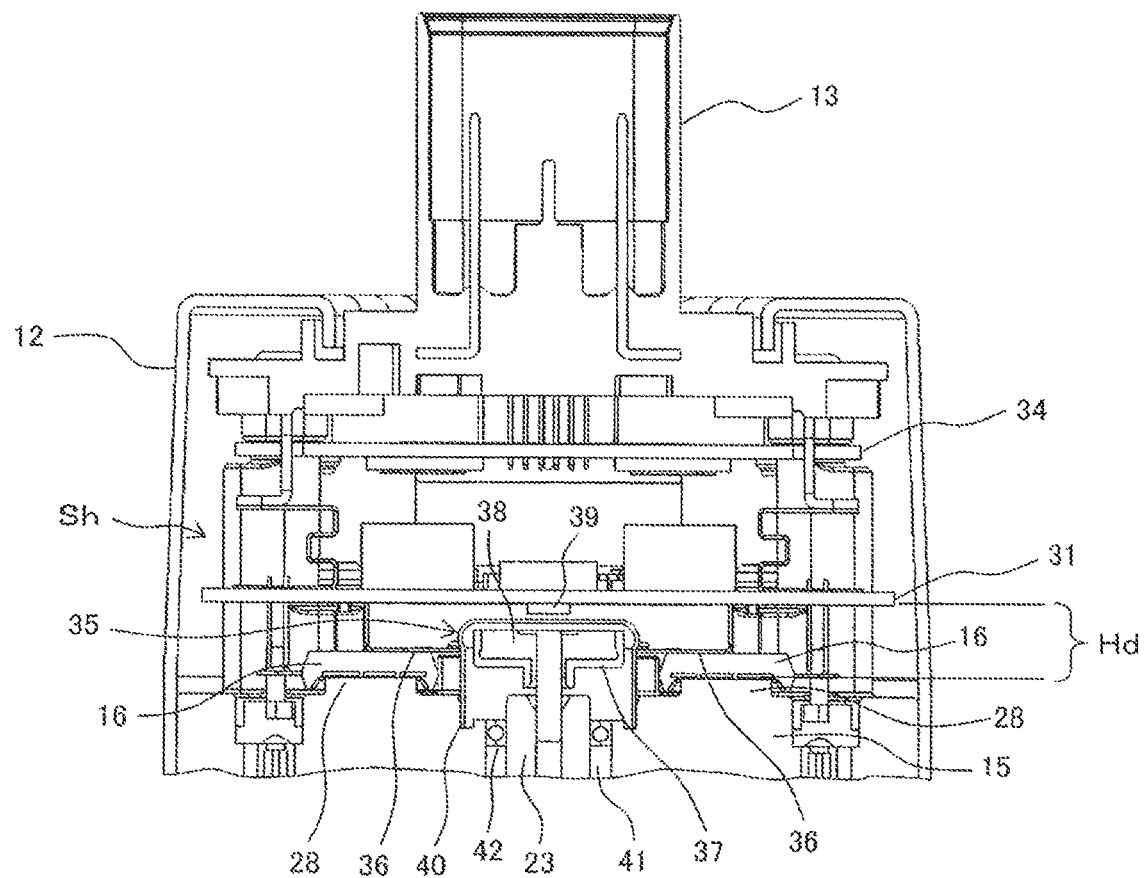
FIG. 9 is a sectional view of the electric power steering device in assembled state, where an electronic control section and surroundings of the electric power steering device are cut by a plane containing its central axis.

The following details specific configuration of the electric power steering device according to the embodiment of the present invention with reference to FIGS. 2 to 9. FIG. 2 shows whole configuration of the electric power steering device according to the present embodiment. FIG. 3 shows components of the electric power steering device shown in FIG. 2 in disassembled state as viewed diagonally. FIGS. 4 to 8 show states of assembling when the components are assembled in an assembling order. FIG. 9 is a sectional view of the electric power steering device, where an electronic control section and surroundings of the electric power steering device are cut by a plane containing its central axis. The following description refers to these drawings as appropriate.

As shown in FIG. 2, the electric power steering device includes electric motor section 8 and electronic control section 9. Electric motor section 8 includes a motor housing 11 and an electric motor not shown. Motor housing 11 includes a cylindrical part made of an aluminum alloy or the like. The electric motor is housed in motor housing 11. Electronic control section 9 includes a metal cover 12, and an electronic control assembly not shown housed in metal cover 12. Metal cover 12 is made of an aluminum alloy or the like, and is arranged at a side of motor housing 11 opposite to the output shaft in the axial direction.

Motor housing 11 and metal cover 12 are fixed to each other at their facing end faces by bonding, welding, or bolting. Metal cover 12 includes an accommodation space inside thereof, which accommodates the electronic control assembly. The electronic control part includes a power supply circuit part for supplying electric power as required, and a power conversion circuit part having power switching elements such as MOSFETs or IGBTs for driving and controlling the electric motor of electric motor section 8, and a control circuit part for controlling the power switching elements. Output terminals of the power switching elements and input terminals of a coil of the electric motor are connected electrically via a bus bar.

A connector terminal assembly 13 is fixed to an end face of metal cover 12 by fixing bolts. Connector terminal assembly 13 includes a connector terminal forming part 13A for power supply, a connector terminal forming part 13B for sensors, and a connector terminal forming part 13C for sending a state of control to external devices. The electronic control assembly housed in metal cover 12 is supplied with electric power from a power supply via the connector terminal forming part 13A made of synthetic resin, and is supplied with sensing signals indicative of operating states from sensors and others via the connector terminal forming part 13B, and sends a present control state of the electric power steering device via the connector terminal forming part 13C.

FIG. 3 shows electric power steering device 6 in exploded perspective view. Inside of motor housing 11, a side yoke not shown is fitted, wherein the side yoke has an annular shape and is made of iron. The electric motor not shown is mounted inside of the side yoke. The electric motor includes an output part 14 structured to apply a steering assist force to the rack via the gear. Description of specific configuration of the electric motor is omitted because it is well known.

Motor housing 11 is made of an aluminum alloy, thereby serving as a heat sink member for dissipating heat to outside atmosphere, wherein the heat is generated by the power conversion circuit part and the power supply circuit part described below. The electric motor and motor housing 11 form the electric motor section.

Electronic control part EC is attached to a housing end face part 15 of motor housing 11 opposite to the output part 14 of the electric motor section. Electronic control part EC includes power conversion circuit part 16, power supply circuit part 17, and control circuit part 18. The housing end face part 15 of motor housing 11 is formed integrally with motor housing 11, but may be formed separately from motor housing 11 and bolted or welded to motor housing 11.

Power conversion circuit part 16, power supply circuit part 17, and control circuit part 18 form redundant systems, namely, a main electronic control system and an auxiliary electronic control system. Normally, the main electronic control system is employed to drive and control the electric motor, and when an abnormality or failure occurs in the main electronic control system, the control is switched from the main electronic control system to the auxiliary electronic control system so that the auxiliary electronic control system drives and controls the electric motor.

Accordingly, as detailed below, heat of the main electronic control system is normally transferred to motor housing 11. When the main electronic control system is failed or abnormal, operation of the main electronic control system is stopped and the auxiliary electronic control system is operated so that heat of the auxiliary electronic control system is transferred to motor housing 11.

However, although not adopted by the present embodiment, there is an alternative configuration that both of the main and auxiliary electronic control systems are simultaneously employed to form a normal electronic control system, and when one of the main and auxiliary electronic control systems is failed or abnormal, only the other electronic control system is employed to drive and control the electric motor with half of full performance. This ensures a limp-home function, although the performance of the electric motor is only half. Accordingly, the heat of the main electronic control system and the auxiliary electronic control system is normally transferred to motor housing 11.

Electronic control part EC is composed of power conversion circuit part 16, power supply circuit part 17, control circuit part 18, and connector terminal assembly 13, which are arranged in this order away from housing end face part 15 of motor housing 11. Control circuit part 18 is configured to generate control signals for driving the switching elements of power conversion circuit part 16, and includes a microcomputer and a peripheral circuit. Power supply circuit part 17 is configured to supply electric power to power conversion circuit part 16, and includes a capacitor, a coil, switching elements, and others. Power conversion circuit part 16 is configured to regulate electric power flowing through the coil of the electric motor, and includes switching elements and others forming three-phase upper and lower arms.

In electronic control part EC, power conversion circuit part 16 and power supply circuit part 17 generate more quantities of heat than others. The generated heat of power conversion circuit part 16 and power supply circuit part 17 is dissipated via motor housing 11 made of the aluminum alloy. This configuration is detailed below.

Connector terminal assembly 13, which is made of synthetic resin, is arranged between control circuit part 18 and metal cover 12, and is connected to a vehicle battery (power supply) and external control devices not shown. Connector terminal assembly 13 is also connected to power conversion circuit part 16, power supply circuit part 17, and control circuit part 18.

Metal cover 12 functions to house and seal liquid-tightly the power conversion circuit part 16, power supply circuit part 17, and control circuit part 18. In the present embodiment, metal cover 12 is welded to motor housing 11. Since metal cover 12 is made of metal, metal cover 12 serves also to dissipate the heat from power conversion circuit part 16, power supply circuit part 17, etc. to the outside.

Figure 4:
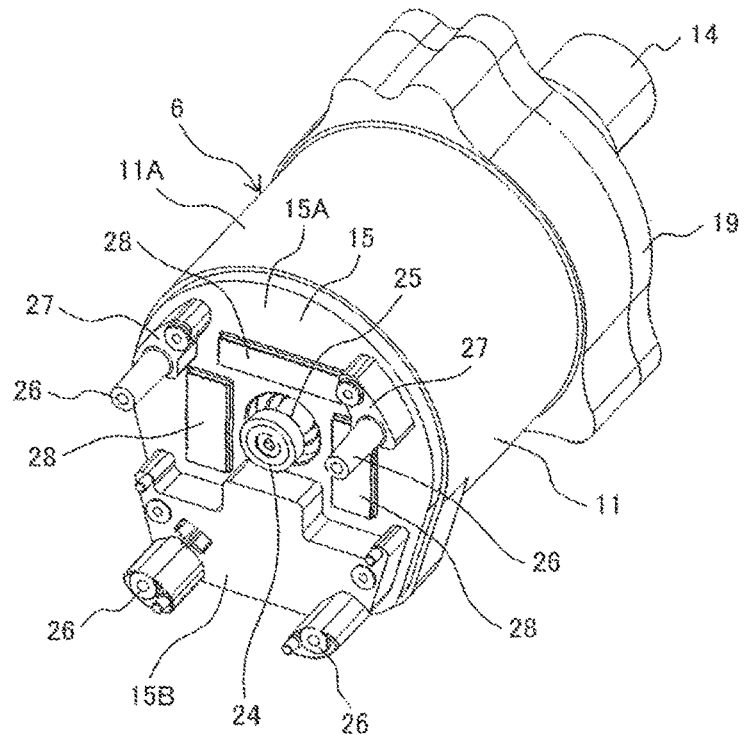
FIG. 4 is a perspective view of a motor housing shown in FIG. 3.
Figure 5:
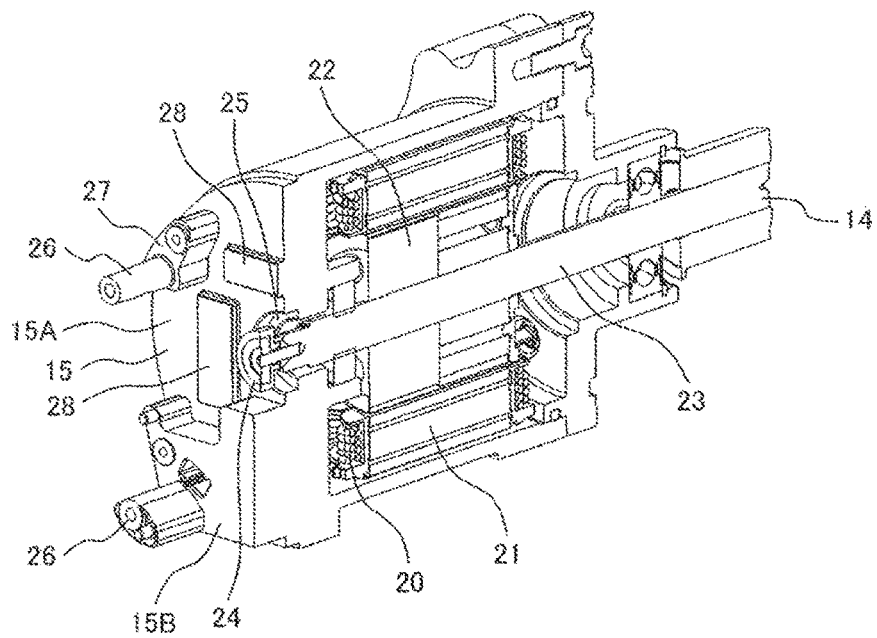
FIG. 5 is a cutaway view of the motor housing shown in FIG. 4, where the motor housing is cut by a plane containing a central axis of the motor housing.

The following describes configuration of the components and a process of assembling the components with reference to FIGS. 4 to 8. FIG. 4 shows an exterior view of motor housing 11, and FIG. 5 shows its axial sectional view. As shown in FIGS. 4 and 5, motor housing 11 is cylindrically shaped and includes a lateral peripheral surface part 11A, housing end face part 15, and a cover 19. The housing end face part 15 closes a first end of lateral peripheral surface part 11A, whereas the cover 19 closes a second end of lateral peripheral surface part 11A. In the present embodiment, lateral peripheral surface part 11A and housing end face part 15 are formed integrally such that motor housing 11 has a cylindrical shape having a bottom. The cover 19 covers the second end of lateral peripheral surface part 11A after the electric motor is mounted inside the lateral peripheral surface part 11A.

As shown in FIG. 5, a stator 21 is fitted inside the lateral peripheral surface part 11A, wherein stator 21 is formed by winding the coil 20 around an iron core. A rotor 22 is rotatably mounted inside the stator 21, wherein a sensor magnet is embedded in rotor 22. A rotating shaft 23 is fixed to rotor 22. One end of rotating shaft 23 forms the output part 14, whereas the other end of rotating shaft 23 forms a rotation-sensing target part 24 serving as a target for sensing the rotational phase and speed of rotating shaft 23. Rotation-sensing target part 24 is provided with the sensor magnet, extending a through hole 25 formed in housing end face part 15, and projecting to the outside. The rotational phase and speed of rotating shaft 23 is sensed by a magnetic sensor such as a GMR element or the like not shown. Rotation-sensing target part 24 is detailed below.

Referring back to FIG. 4, the surface of housing end face part 15 opposite to the output part 14 of rotating shaft 23 is formed with a power conversion circuit part heat dissipation section 15A for power conversion circuit part 16 (see FIG. 3) and a power supply circuit part heat dissipation section 15B for power supply circuit part 17 (see FIG. 3), which is a characterizing feature. Four corners of housing end face part 15 are formed integrally with board-fixing projecting parts 26, each of which extends perpendicularly from housing end face part 15. Each board-fixing projecting part 26 is formed with a threaded hole inside. Board-fixing projecting parts 26 are configured to fix a board of control circuit part 18 described below. Each board-fixing projecting part 26 projecting from power conversion circuit part heat dissipation section 15A described below is formed with a board-receiving part 27 having the same height as power supply circuit part heat dissipation section 15B described below in the axial direction. Each board-receiving part 27 is configured to mount a glass epoxy board 31 described below which is a power supply circuit part board of power supply circuit part 17.

The flat area forming the housing end face part 15 and extending in the radial direction and perpendicular to rotating shaft 23 is divided into two regions, namely, power conversion circuit part heat dissipation section 15A and power supply circuit part heat dissipation section 15B. Power conversion circuit part 16 is attached to power conversion circuit part heat dissipation section 15A. Power supply circuit part 17 is attached to power supply circuit part heat dissipation section 15B. In the present embodiment, the area of power conversion circuit part heat dissipation section 15A is set larger than that of power supply circuit part heat dissipation section 15B, for ensuring more space for mounting the power conversion circuit part 16, because power conversion circuit part 16 includes redundant systems as described above, and thereby requires a sufficient mounting space.

There is a step between power conversion circuit part heat dissipation section 15A and power supply circuit part heat dissipation section 15B such that power conversion circuit part heat dissipation section 15A and power supply circuit part heat dissipation section 15B have different heights in the axial direction (the direction in which rotating shaft 23 extends). Namely, power supply circuit part heat dissipation section 15B is formed with an outward step away with respect to power conversion circuit part heat dissipation section 15A in the axial direction of rotating shaft 23 of the electric motor. This step is set to have a height enough to prevent interference between power conversion circuit part 16 and power supply circuit part 17 when power supply circuit part 17 is assembled after power conversion circuit part 16 is assembled.

Furthermore, the step is set to have such a size in the axial direction of rotating shaft 23 that the step projects in the axial direction of rotating shaft 23 with respect to rotation-sensing target part 24 and the magnetic sensor placed on glass epoxy board 31 of power supply circuit part 17 is positioned in close proximity to and out of contact with the sensor magnet of rotation-sensing target part 24 as detailed below. The distance therebetween is desired to be as short as possible, and is set to a value that is predetermined taking account of errors in design. Moreover, power conversion circuit part heat dissipation section 15A is placed closer to the electric motor than the sensor magnet.

Power conversion circuit part heat dissipation section 15A is formed with three heat dissipation projecting parts 28, wherein each heat dissipation projecting part 28 has a narrow rectangular shape. Heat dissipation projecting parts 28 are configured to mount power conversion circuit part 16 thereon, wherein power conversion circuit part 16 described below has redundant systems. Each heat dissipation projecting part 28 projects away from the electric motor in the direction of rotating shaft 23 of the electric motor.

Power supply circuit part heat dissipation section 15B is generally flat and is configured to mount power supply circuit part 17 thereon, where power supply circuit part 17 is described below. Accordingly, each heat dissipation projecting part 28 serves as a heat dissipation region to transfer heat from power conversion circuit part 16 to housing end face part 15, whereas power supply circuit part heat dissipation section 15B serves as a heat dissipation region to transfer heat from power supply circuit part 17 to housing end face part 15.

Each heat dissipation projecting part 28 may be omitted so that power conversion circuit part heat dissipation section 15A serves as a heat dissipation region to transfer heat from power conversion circuit part 16 to housing end face part 15. However, in the present embodiment, power conversion circuit part 16 is securely fixed to heat dissipation projecting part 28 by welding a metal board of power conversion circuit part 16 to heat dissipation projecting part 28 by friction stir welding.

At housing end face part 15 of motor housing 11 according to the present embodiment described above, the axial size can be made compact because there is no heat sink member. Moreover, since motor housing 11 has a sufficient thermal capacity, the heat generated in power supply circuit part 17 and power conversion circuit part 16 can be dissipated to the outside effectively.

Figure 6:
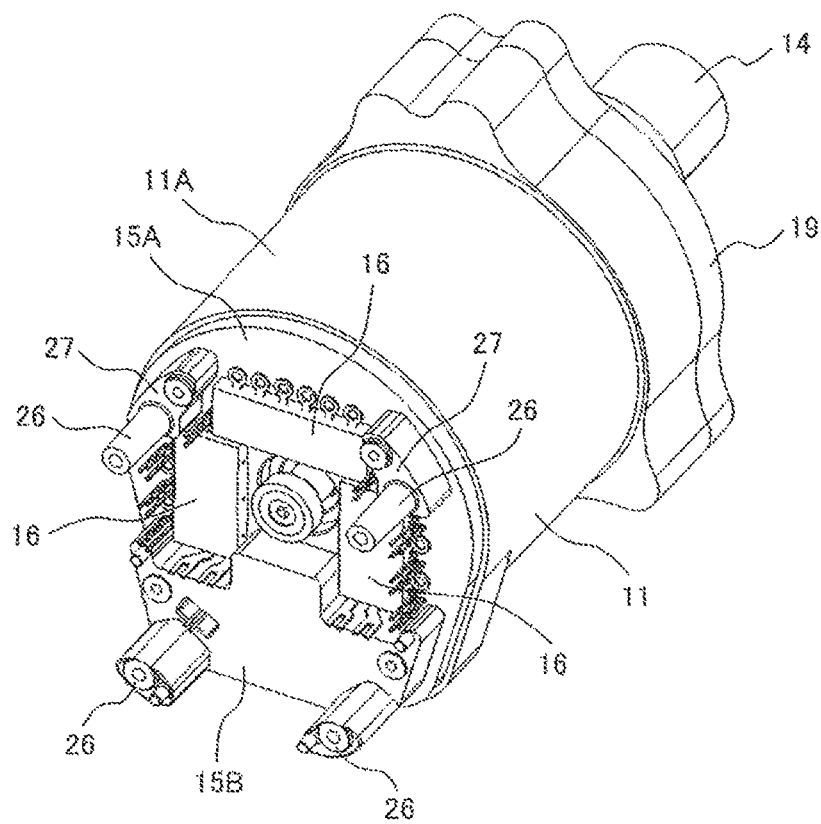
FIG. 6 is a perspective view of the motor housing shown in FIG. 4 where a power conversion circuit part is mounted to the motor housing.

FIG. 6 shows a state where power conversion circuit part 16 is placed on heat dissipation projecting parts 28 (see FIG. 4). As shown in FIG. 6, power conversion circuit part 16 composed of redundant systems is placed on heat dissipation projecting parts 28 (see FIG. 4) formed in power conversion circuit part heat dissipation section 15A. The switching elements constituting the power conversion circuit part 16 are placed on a metal board, which is made of an aluminum-based metal material in this example, allowing their generated heat to be dissipated effectively. The metal board is welded to heat dissipation projecting part 28 by friction stir welding.

In this way, the metal board is securely fixed to heat dissipation projecting parts 28 (see FIG. 4), to allow generated heat of the switching elements to be transferred to heat dissipation projecting parts 28 (see FIG. 4) effectively. The heat transferred to heat dissipation projecting parts 28 (see FIG. 4) is dissipated to power conversion circuit part heat dissipation section 15A, and then to lateral peripheral surface part 11A of motor housing 11, and finally to the outside. As described above, power conversion circuit part 16 is prevented from interfering with power supply circuit part 17 described below, because the height of power conversion circuit part 16 is shorter than that of power supply circuit part heat dissipation section 15B in the axial direction.

FIG. 7 shows a state where power supply circuit part 17 is placed over power conversion circuit part 16. As shown in FIG. 7, power supply circuit part heat dissipation section 15B is covered by power supply circuit part 17. Power supply circuit part 17 includes glass epoxy board 31 as a power supply circuit part board, and capacitors 29, coils 30 and others placed on glass epoxy board 31. Power supply circuit part 17 includes redundant systems, each of which includes a power supply circuit composed of capacitors 29 and coil 30 and arranged symmetrically with each other as shown in FIG. 7.

The surface of glass epoxy board 31 facing the power supply circuit part heat dissipation section 15B (see FIG. 6) is fixed to housing end face part 15 in contact with power supply circuit part heat dissipation section 15B. As shown in FIG. 7, this fixing is implemented by bolting with a fixing bolt not shown through a threaded hole formed in each board-receiving part 27 of board-fixing projecting part 26, and also with a fixing bolt not shown through a threaded hole formed in power supply circuit part heat dissipation section 15B (see FIG. 6).

The configuration that power supply circuit part 17 is based on glass epoxy board 31 allows the components of power supply circuit part 17 to be mounted on both sides of the power supply circuit part 17. The surface of glass epoxy board 31 facing the power supply circuit part heat dissipation section 15B (see FIG. 6) is provided with the magnetic sensor including a GMR element and a sensing circuit not shown. The magnetic sensor is configured to sense the rotational phase and speed of rotating shaft 23 in cooperation with rotation-sensing target part 24 (see FIG. 5) that is provided at the end part of rotating shaft 23 opposite to output part 14 of rotating shaft 23 (see FIG. 5).

As described above, the step of power supply circuit part heat dissipation section 15B is set to have such a size that in the state where glass epoxy board 31 of power supply circuit part 17 is fixed to power supply circuit part heat dissipation section 15B, the magnetic sensor placed on glass epoxy board 31 is positioned in close proximity to and out of contact with the sensor magnet.

The configuration that glass epoxy board 31 is fixed to power supply circuit part heat dissipation section 15B (see FIG. 6) in contact with power supply circuit part heat dissipation section 15B as described above, allows the generated heat of power supply circuit part 17 to be transferred to power supply circuit part heat dissipation section 15B effectively. The heat transferred to power supply circuit part heat dissipation section 15B (see FIG. 6) is transferred and spread into lateral peripheral surface part 11A of motor housing 11, and then dissipated to the outside. In order to enhance the thermal conductivity, an adhesive agent or dissipation grease or dissipation sheet having a high thermal conductivity may be disposed between glass epoxy board 31 and power supply circuit part heat dissipation section 15B (see FIG. 6).

FIG. 8 shows a state where control circuit part 18 is placed over the power supply circuit part 17. As shown in FIG. 8, electric motor section 8 is arranged over power supply circuit part 17. Microcomputers 32 and peripheral circuits 33 constituting the control circuit part 18 are placed on glass epoxy board 34. Control circuit part 18 includes redundant systems, each of which includes a control circuit composed of microcomputer 32 and peripheral circuits 33 and arranged symmetrically with each other as shown in FIG. 8.

Microcomputers 32 and peripheral circuits 33 may be placed on the surface of glass epoxy board 34 facing the power supply circuit part 17. As described below, FIG. 9 shows an example where microcomputer 32 and peripheral circuit 33 are placed on the surface of glass epoxy board 34 facing the power supply circuit part 17.

As shown in FIG. 8, glass epoxy board 34 is fixed by fixing bolts not shown through the threaded holes formed in the top portions of board-fixing projecting parts 26 (see FIG.

7). The space between glass epoxy board 31 of power supply circuit part 17 (see FIG. 7) and glass epoxy board 34 of control circuit part 18 is used for arrangement of capacitors 29, coils 30 and others of power supply circuit part 17 shown in FIG. 7.

The following further describes a configuration including the housing end face part 15 of motor housing 11 and electronic control part EC with reference to FIG. 9. In FIG. 9, electronic control part EC is arranged adjacent to housing end face part 15 of motor housing 11, and is covered by metal cover 12, and is thereby accommodated in an accommodation space Sh formed by metal cover 12 and housing end face part 15.

A magnet hold part 37 is fixed to the end part of rotating shaft 23 opposite to output part 14, wherein sensor magnet 38 is implemented by a permanent magnet and housed in and fixed to magnet hold part 37, wherein sensor magnet 38 forms rotation-sensing target part 24. The end part of rotating shaft 23, magnet hold part 37, and sensor magnet 38 project toward the electronic control part EC with respect to housing end face part 15 of motor housing 11.

Magnetic sensor 39 such as a GMR element is fixed to the surface of glass epoxy board 31 of power supply circuit part 17 facing the motor housing 11, wherein power supply circuit part 17 is arranged in electronic control part EC. Magnetic sensor 39 has a magnet-sensing function and is configured to sense the rotational phase or the like of rotating shaft 23 based on rotation of sensor magnet 38. Accordingly, magnetic sensor 39 is placed to correspond in position to sensor magnet 38 of rotation-sensing target part 24.

The step Hd formed between power conversion circuit part heat dissipation section 15A (i.e. heat dissipation projecting part 28) and power supply circuit part heat dissipation section 15B (see FIG. 4), wherein glass epoxy board 31 of power supply circuit part 17 is placed on power supply circuit part heat dissipation section 15B, is set to have such a size that power supply circuit part heat dissipation section 15B projects in the axial direction of rotating shaft 23 with respect to rotation-sensing target part 24 and magnetic sensor 39 placed on glass epoxy board 31 of power supply circuit part 17 is positioned in close proximity to and out of contact with sensor magnet 38 of rotation-sensing target part 24. Moreover, power conversion circuit part heat dissipation section 15A is placed closer to the electric motor than sensor magnet 38.

The configuration that power conversion circuit part heat dissipation section 15A is placed closer to the electric motor than sensor magnet 38, serves to allow power supply circuit part 17 to be positioned close to sensor magnet 38. This allows the axial size to be shortened, and allows magnetic sensor 39 to be positioned close to sensor magnet 38, and thereby serves to enhance the sensitivity of sensing of magnetic sensor 39.

If power conversion circuit part heat dissipation section 15A is positioned farther from the electric motor than sensor magnet 38, it then leads to placement of glass epoxy board 31 of power supply circuit part 17 in a position far from sensor magnet 38. This causes an increase in the axial size and an increase in the distance between sensor magnet 38 and magnetic sensor 39, and thereby adversely affects the sensitivity of sensing.

Power conversion circuit part holder 35 is fixed with a clearance around an outer periphery of magnet hold part 37 and sensor magnet 38. As shown in FIG. 9, power conversion circuit part holder 35 is formed to have a hollow body having a bottom (i.e. a cup-shaped body), which is composed of a cylindrical hollow section wall part and a circular bottom wall part. Power conversion circuit part holder 35 is arranged to cover the outer periphery of magnet hold part 37 and sensor magnet 38, and is fixed tightly in a fixing hole 40 in a manner of press fit, adhesion, etc., wherein fixing hole 40 is formed in housing end face part 15.

Power conversion circuit part holder 35 includes an outer peripheral surface formed with a resilient function member 36 that has a substantially rectangular shape extending radially outwardly. Resilient function member 36 includes three resilience-imparting parts which are arranged at intervals of 90 degrees. Each resilience-imparting part has a function of resiliently pressing a corresponding one of power conversion circuit parts 16 onto a corresponding one of heat dissipation projecting parts 28, wherein power conversion circuit parts 16 are arranged at intervals of 90 degrees similarly as shown in FIG. 6.

Fixing hole 40 is formed in a portion of housing end face part 15 surrounding a through hole 41 to have a circular shape around through hole 41, wherein through hole 41 is formed at or near a center of housing end face part 15, wherein rotating shaft 23 extends through the through hole 41. The outer peripheral surface of power conversion circuit part holder 35 forms a hollow section of power conversion circuit part holder 35 and is fixed to an inner periphery of fixing hole 40 in a manner of press fit, adhesion, etc. A ball bearing 42 is provided in through hole 41 and is structured to support the rotating shaft 23 rotatably. In this way, the accommodation space Sh formed in electronic control part EC is basically separated water-tightly from the inside of motor housing 11 by housing end face part 15 and power conversion circuit part holder 35.

On the other hand, power conversion circuit part holder 35 includes a waterproof breathable membrane structured to allow passing of air and prevent passing of water, and thereby allow flowing of air between the internal space of motor housing 11 and the internal space of metal cover 12. This serves to prevent water, which enters the motor housing 11, from adversely affecting the electronic control part EC inside the metal cover 12.

As shown in FIG. 3, connector terminal assembly 13 is connected to power conversion circuit part 16, power supply circuit part 17, and control circuit part 18. Furthermore, as shown in FIG. 2, metal cover 12 is assembled to seal liquid-tightly the power conversion circuit part 16, power supply circuit part 17, and control circuit part 18. Assembling of the electric power steering device is thus completed.

As described above, according to the present embodiment, power conversion circuit part 16 is placed on the upper side of heat dissipation projecting part 28 formed in power conversion circuit part heat dissipation section 15A. This allows the generated heat of the switching elements of power conversion circuit part 16 to be transferred to heat dissipation projecting part 28 effectively. Furthermore, the heat transferred to heat dissipation projecting part 28 is spread in power conversion circuit part heat dissipation section 15A, and transferred to lateral peripheral surface part 11A of motor housing 11, and dissipated to the outside.

Similarly, power supply circuit part 17 is placed on the upper side of power supply circuit part heat dissipation section 15B. The surface of glass epoxy board 31 of power supply circuit part 17 facing the power supply circuit part heat dissipation section 15B, on which the circuit elements of power supply circuit part 17 are placed, is fixed to housing end face part 15 in contact with power supply circuit part heat dissipation section 15B. This allows the generated heat of power supply circuit part 17 to be transferred to power supply circuit part heat dissipation section 15B effectively. The heat transferred to power supply circuit part heat dissipation section 15B is transferred to and spread in lateral peripheral surface part 11A of motor housing 11, and dissipated to the outside.

The configuration that power conversion circuit part heat dissipation section 15A is placed closer to the electric motor than sensor magnet 38, serves to allow power supply circuit part 17 to be positioned close to sensor magnet 38.

With the configuration described above, the heat generated in power supply circuit part 17 and power conversion circuit part 16 is transferred to housing end face part 15 of motor housing 11, allowing to omit a heat sink member, and thereby shorten the axial size. Moreover, since motor housing 11 has a sufficient thermal capacity, the heat generated in the power supply circuit part and the power conversion circuit part can be dissipated to the outside effectively. Furthermore, the configuration that power conversion circuit part heat dissipation section 15A is placed closer to the electric motor than sensor magnet 38, serves to allow the axial size to be further shortened, while allowing the sensor magnet and the magnetic sensor to be positioned close to each other and thereby allowing sensitivity of the sensing of the magnetic sensor to be enhanced.

As described above, the present invention is exemplified by the configuration that: the motor housing includes the housing end face part opposite to the output part of the rotating shaft of the electric motor; the housing end face part includes the power conversion circuit part heat dissipation section and the power supply circuit part heat dissipation section formed to allow at least generated heat of the power conversion circuit part and the power supply circuit part to be transferred to the motor housing; the sensor magnet is fixed to the end part of the rotating shaft opposite to the output part of the rotating shaft and structured to constitute the rotation-sensing target part for sensing rotation of the rotating shaft; and the power conversion circuit part heat dissipation section of the housing end face part is positioned closer to the electric motor than the sensor magnet.

With this configuration, the feature that the generated heat of the power supply circuit part and the power conversion circuit part is transferred to the housing end face part of the motor housing makes it possible to shorten the axial size with no heat sink member provided. Moreover, since the motor housing has a sufficient thermal capacity, the heat generated in the power supply circuit part and the power conversion circuit part can be dissipated to the outside effectively. Furthermore, the feature that the power conversion circuit part heat dissipation section is positioned closer to the electric motor than the sensor magnet, serves to allow the axial size to be further shortened, while allowing the sensor magnet and the magnetic sensor to be positioned close to each other and thereby allowing sensitivity of the sensing of the magnetic sensor to be enhanced.

The present invention is not limited to the embodiment described above, but includes various modified embodiments. The described embodiment is detailed merely for easy understanding of the present invention, and the present invention is not limited to a form including all of the features described above, for example. Part of features of one of the embodiments may be replaced with features of another one of the embodiments. Features of one of the embodiments may be additionally provided with features of another one of the embodiments. Part of features of each of the embodiments may be additionally provided with other features or removed or replaced.

The electric drive device according to the embodiment described above may be exemplified as follows.

According to one aspect, an electric drive device includes: a motor housing structured to house an electric motor, wherein the motor housing includes a housing end face part opposite to an output part of a rotating shaft of the electric motor, and wherein the electric motor is structured to drive a controlled object of a mechanical system; and an electronic control part arranged at the housing end face part, and configured to drive the electric motor, wherein the electronic control part includes a control circuit part, a power supply circuit part, and a power conversion circuit part; wherein the housing end face part includes a power conversion circuit part heat dissipation section and a power supply circuit part heat dissipation section, and includes a step between the power supply circuit part heat dissipation section and the power conversion circuit part heat dissipation section such that the power supply circuit part heat dissipation section projects away from the electric motor with respect to the power conversion circuit part heat dissipation section; the power conversion circuit part is mounted to the power conversion circuit part heat dissipation section in a manner to allow generated heat of the power conversion circuit part to be transferred to the motor housing via the power conversion circuit part heat dissipation section; the power supply circuit part is mounted to the power supply circuit part heat dissipation section in a manner to allow generated heat of the power supply circuit part to be transferred to the motor housing via the power supply circuit part heat dissipation section; the electric drive device further includes a sensor magnet fixed to an end part of the rotating shaft opposite to the output part of the rotating shaft and structured to constitute a rotation-sensing target part for sensing rotation of the rotating shaft; and the power conversion circuit part heat dissipation section of the housing end face part is positioned closer to the electric motor than the sensor magnet.

According to a preferable aspect, the electric drive device is configured such that: the power supply circuit part includes a power supply circuit part board arranged to face the rotation-sensing target part; and the electric drive device further comprises a magnetic sensor placed on the power supply circuit part board to correspond in position to the sensor magnet of the rotation-sensing target part, and configured to sense rotation of the sensor magnet.

According to another preferable aspect, the electric drive device according to one of the foregoing aspects is configured such that the power conversion circuit part heat dissipation section includes a heat dissipation projecting part projecting away from the electric motor in an axial direction of the electric motor.

According to a further preferable aspect, the electric drive device according to one of the foregoing aspects is configured such that the power conversion circuit part, the power supply circuit part, and the control circuit part of the electronic control part are arranged in this order away from the electric motor in the axial direction of the electric motor.

The electric power steering device according to the embodiment described above may be exemplified as follows.

According to one aspect, an electric power steering device includes: an electric motor structured to apply a steering assist force to a steering shaft, depending on an output from a torque sensor, wherein the torque sensor is structured to sense a direction of rotation of the steering shaft and a rotating torque applied to the steering shaft; a motor housing structured to house the electric motor, wherein the motor housing includes a housing end face part opposite to an output part of a rotating shaft of the electric motor; and an electronic control part arranged at the housing end face part, and configured to drive the electric motor, wherein the electronic control part includes a control circuit part, a power supply circuit part, and a power conversion circuit part; wherein the housing end face part includes a power conversion circuit part heat dissipation section and a power supply circuit part heat dissipation section, and includes a step between the power supply circuit part heat dissipation section and the power conversion circuit part heat dissipation section such that the power supply circuit part heat dissipation section projects away from the electric motor with respect to the power conversion circuit part heat dissipation section; the power conversion circuit part is mounted to the power conversion circuit part heat dissipation section in a manner to allow generated heat of the power conversion circuit part to be transferred to the motor housing via the power conversion circuit part heat dissipation section; the power supply circuit part is mounted to the power supply circuit part heat dissipation section in a manner to allow generated heat of the power supply circuit part to be transferred to the motor housing via the power supply circuit part heat dissipation section; the electric power steering device further includes a sensor magnet fixed to an end part of the rotating shaft opposite to the output part of the rotating shaft and structured to constitute a rotation-sensing target part for sensing rotation of the rotating shaft; and the power conversion circuit part heat dissipation section of the housing end face part is positioned closer to the electric motor than the sensor magnet.

According to a preferable aspect, the electric power steering device is configured such that: the power supply circuit part includes a power supply circuit part board arranged to face the rotation-sensing target part; and the electric power steering device further comprises a magnetic sensor placed on the power supply circuit part board to correspond in position to the sensor magnet of the rotation-sensing target part, and configured to sense rotation of the sensor magnet.

According to another preferable aspect, the electric power steering device according to one of the foregoing aspects is configured such that the power conversion circuit part heat dissipation section includes a heat dissipation projecting part projecting away from the electric motor in an axial direction of the electric motor.

According to a further preferable aspect, the electric power steering device according to one of the foregoing aspects is configured such that the power conversion circuit part, the power supply circuit part, and the control circuit part of the electronic control part are arranged in this order away from the electric motor in the axial direction of the electric motor.

The invention claimed is:

1. An electric drive device comprising:
a motor housing structured to house an electric motor, wherein the motor housing includes a housing end face part opposite to an output part of a rotating shaft of the electric motor, and wherein the electric motor is structured to drive a controlled object of a mechanical system; and
an electronic control part arranged at the housing end face part, and configured to drive the electric motor, wherein the electronic control part includes a control circuit part, a power supply circuit part, and a power conversion circuit part; wherein the housing end face part includes a power conversion circuit part heat dissipation section and a power supply circuit part heat dissipation section, and includes a step between the power supply circuit part heat dissipation section and the power conversion circuit part heat dissipation section such that the power supply circuit part heat dissipation section projects away from the electric motor with respect to the power conversion circuit part heat dissipation section;
the power conversion circuit part is mounted to the power conversion circuit part heat dissipation section in a manner to allow generated heat of the power conversion circuit part to be transferred to the motor housing via the power conversion circuit part heat dissipation section;
the power supply circuit part is mounted to the power supply circuit part heat dissipation section in a manner to allow generated heat of the power supply circuit part to be transferred to the motor housing via the power supply circuit part heat dissipation section;
the electric drive device further comprises a sensor magnet fixed to an end part of the rotating shaft opposite to the output part of the rotating shaft and structured to constitute a rotation-sensing target part for sensing rotation of the rotating shaft; and
the power conversion circuit part heat dissipation section of the housing end face part is positioned closer to the electric motor than the sensor magnet.

2. The electric drive device according to claim 1, wherein:
the power supply circuit part includes a power supply circuit part board arranged to face the rotation-sensing target part; and
the electric drive device further comprises a magnetic sensor placed on the power supply circuit part board to correspond in position to the sensor magnet of the rotation-sensing target part, and configured to sense rotation of the sensor magnet.

3. The electric drive device according to claim 2, wherein the power conversion circuit part heat dissipation section includes a heat dissipation projecting part projecting away from the electric motor in an axial direction of the electric motor.

4. The electric drive device according to claim 3, wherein the power conversion circuit part, the power supply circuit part, and the control circuit part of the electronic control part are arranged in this order away from the electric motor in the axial direction of the electric motor.

5. An electric power steering device comprising:
an electric motor structured to apply a steering assist force to a steering shaft, depending on an output from a torque sensor, wherein the torque sensor is structured to sense a direction of rotation of the steering shaft and a rotating torque applied to the steering shaft;
a motor housing structured to house the electric motor, wherein the motor housing includes a housing end face part opposite to an output part of a rotating shaft of the electric motor; and
an electronic control part arranged at the housing end face part, and configured to drive the electric motor, wherein the electronic control part includes a control circuit part, a power supply circuit part, and a power conversion circuit part; wherein
the housing end face part includes a power conversion circuit part heat dissipation section and a power supply circuit part heat dissipation section, and includes a step between the power supply circuit part heat dissipation section and the power conversion circuit part heat dissipation section such that the power supply circuit part heat dissipation section projects away from the electric motor with respect to the power conversion circuit part heat dissipation section;

the power conversion circuit part is mounted to the power conversion circuit part heat dissipation section in a manner to allow generated heat of the power conversion circuit part to be transferred to the motor housing via the power conversion circuit part heat dissipation section;

the power supply circuit part is mounted to the power supply circuit part heat dissipation section in a manner to allow generated heat of the power supply circuit part to be transferred to the motor housing via the power supply circuit part heat dissipation section;

the electric power steering device further comprises a sensor magnet fixed to an end part of the rotating shaft opposite to the output part of the rotating shaft and structured to constitute a rotation-sensing target part for sensing rotation of the rotating shaft; and the power conversion circuit part heat dissipation section of the housing end face part is positioned closer to the electric motor than the sensor magnet.

6. The electric power steering device according to claim 5, wherein:

the power supply circuit part includes a power supply circuit part board arranged to face the rotation-sensing target part; and the electric power steering device further comprises a magnetic sensor placed on the power supply circuit part board to correspond in position to the sensor magnet of the rotation-sensing target part, and configured to sense rotation of the sensor magnet.

7. The electric power steering device according to claim 6, wherein the power conversion circuit part heat dissipation section includes a heat dissipation projecting part projecting away from the electric motor in an axial direction of the electric motor.

8. The electric power steering device according to claim 7, wherein the power conversion circuit part, the power supply circuit part, and the control circuit part of the electronic control part are arranged in this order away from the electric motor in the axial direction of the electric motor.

* * * * *